United States Patent [19]

Meyer

[11] Patent Number: 4,779,058

[45] Date of Patent: Oct. 18, 1988

[54] OHMICALLY ISOLATED INPUT CIRCUIT

[75] Inventor: John D. Meyer, Albany, Calif.

[73] Assignee: Meyer Sound Laboratories, Inc.

[21] Appl. No.: 890,691

[22] Filed: Jul. 25, 1986

[51] Int. Cl.⁴ .............................................. H03F 3/00
[52] U.S. Cl. .................................... 330/188; 330/190
[58] Field of Search ..................... 330/188, 190, 124 R

[56] References Cited

FOREIGN PATENT DOCUMENTS 602551 3/1960 Italy ..................................... 330/188

Primary Examiner—Gene Wan
Attorney, Agent, or Firm—Donald L. Beeson

[57] ABSTRACT

An ohmically isolated input circuit accepts a three pin connector of a cable from a signal source output for virtually all three pin connector standards, and will output a signal of the same voltage gain regardless of which of the three pin connector standards are used. The input circuit includes two magnetically isolated, serially connected transformers and three input terminals connected to the transformer's serially connected primary windings so that the input signal to any two of the three terminals is transformer coupled without change in gain to the circuit output through one or the other or both of the transformers depending on which two input terminals are selected. By using current transformers rather than voltage transformers the transformers run at very low signal levels thereby permitting the use of inexpensive and lightweight transformers without the introduction of distortion.

17 Claims, 4 Drawing Sheets

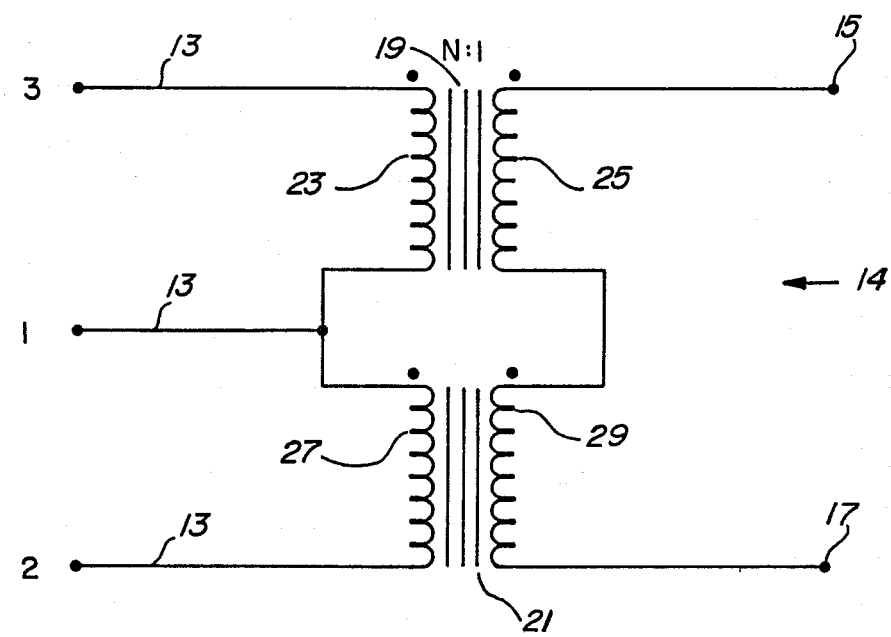
FIG._1
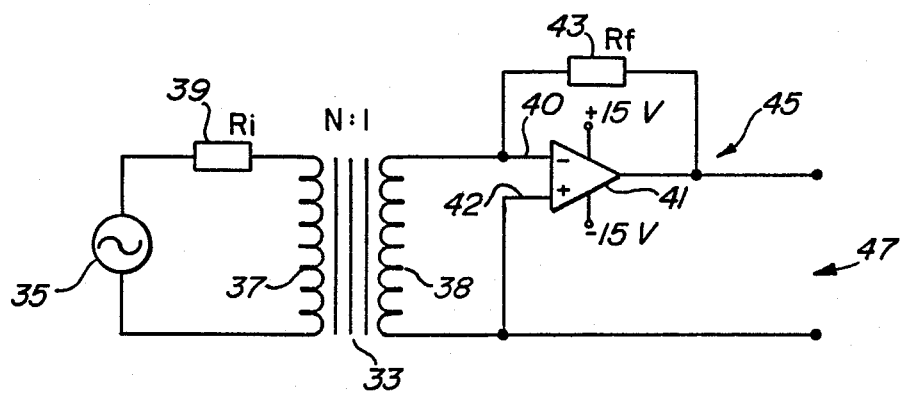
FIG._2

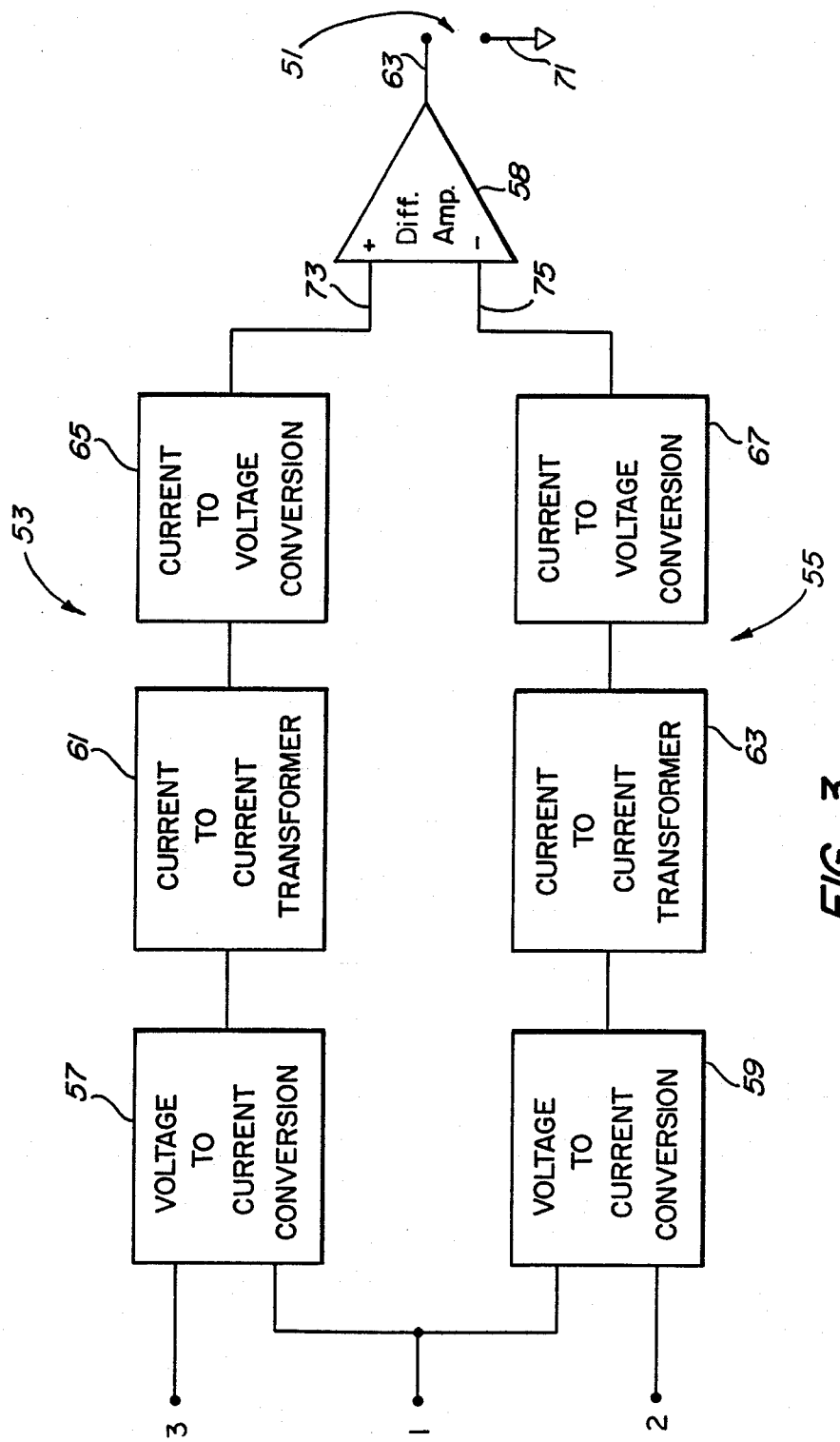
FIG._3

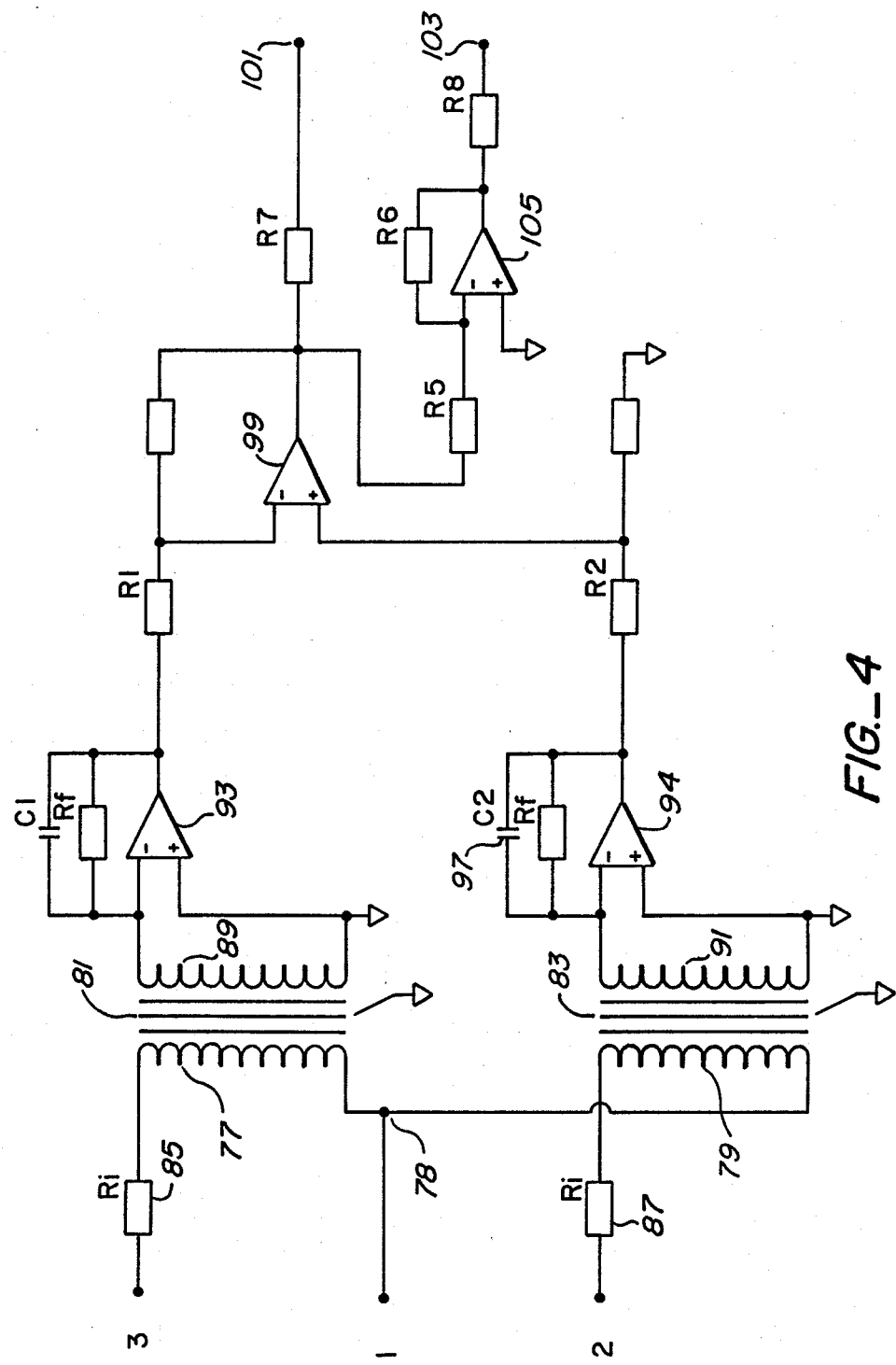
FIG._4

| SIGNAL SOURCE OUTPUT CONFIGURATION | WIRING OF INPUT | | | OUTPUT POLARITY |
|---|---|---|---|---|
| | PIN 1 | PIN 2 | PIN 3 | |
| BALANCED | N/C | − | + | + |
| | N/C | + | − | − |
| | C | − | + | + |
| | C | + | − | − |
| | − | − | + | + |
| | − | + | − | − |
| | − | N/C | + | + |
| | − | + | N/C | − |
| | + | N/C | − | − |
| | + | − | N/C | + |
| UNBALANCED | N/C | C | + | + |
| | N/C | + | C | − |
| | C | C | + | + |
| | C | + | C | − |
| | C | N/C | + | + |
| | + | N/C | C | − |
| | C | + | N/C | − |
| | + | C | N/C | + |

OHMICALLY ISOLATED INPUT CIRCUIT

BACKGROUND OF THE INVENTION

The present invention generally relates to the input stage of signal processing circuits, such as audio amplifiers, and more particularly to input stages of electronic gear which use 3-pin input connectors.

A common problem that plagues professional audio systems using patchable 3-circuit connectors is that there is no universal standard for connecting the pins to be used for the signal, signal return, and chassis common. Different manufacturers, especially manufacturers in different countries such as U.S. and European manufacturers, use different pin connections, and the signal source output configuration from one piece of equipment to another will vary widely and include balanced and unbalanced outputs. Consequently, equipment is often cabled together without matching input and output pin configurations causing unexpected signal inversion, unwanted change of gain, and power frequency injection often referred to as "hum" or "rizz".

The present invention overcomes the above-mentioned problems associated with using unmatched 3-circuit connectors by providing a unique input stage circuit that avoids undesirable changes of gain over a wide range of possible input pin connector configurations. The input circuit of the present invention also eliminates power frequency injection by breaking the ohmic connection between the signal source chassis and the chassis of the piece of equipment using the input circuit of the invention.

More specifically, the invention provides an input stage for an amplifier or the like that will accept a signal source output from equipment of most any manufacturer regardless of connector design conventions. Assuming equal input signal drive levels, the output of the input stage, and thus the signal input to the amplifier, will be the same (except for possible reverse polarities) regardless of which two pins see the signal, and regardless of whether the pins are connected to a balanced or unbalanced output. Moreover, using the input circuit of the invention there will be no input connection that will short the output of the signal source (other than connecting the hot pin directly to the input connector shell.) The input circuit of the invention will accommodate virtually all 3-pin connector standards and permit the user to employ a variety of types of phase reversing adaptors without fear of shorting out the signal source or suffering in any way a change in gain.

SUMMARY OF THE INVENTION

Ohmic isolation and uniform gain characteristics of an input stage circuit are achieved according to the invention by using a transformer coupled input circuit wherein the three input terminals of the input circuit which receives an input voltage from a 3-pin connector are connected to a means for transformer coupling any two of the input terminals to the same output at the same voltage gain. Two magnetically isolated, series connected transformers are used, one pair of input terminals being transformer coupled to the output through one of the transformers, another input terminal pair being coupled to the output through another of the transformers and the third input terminal pair being coupled to the same output through the series combination of transformers. As will be understood from the description of the illustrated embodiment, no matter which of the three connector pins supply the signal, the signal gain of the input circuit will be the same if the turn ratios of the two transformers of the circuit are the same, and provided that neither of the transformers are magnetically coupled to the other. Also, because of the transformer coupling, ohmic isolation will be achieved at the input stage for inhibiting ground loops at the input.

In a further aspect of the invention, the two transformers of the present invention are connected to a "hum bucking" manner whereby common mode signals induced in the two transformers are mutually cancelled out whereas the input drive signals are passed through the circuit. Ordinarily transformer coupling at either the input or output stages of an amplifier is achieved with a signel transformer which, to prevent the problem of hum, such as is pervasive in broadcast systems, requires extensive shielding, greatly adding to the cost and weight of the transformers. Using the twin transformer coupling circuit of the present invention, much cheaper and lighter unshielded transformers can be used.

The invention additionally provides for operating the transformers of the circuit in the microwatt power range whereby non-linearities associated with core eddy losses, hysteresis problems, ringing and phase shift normally associated with audio-transformer designs, are substantially reduced. Specifically, the present invention, in its preferred embodiment, provides a high gain feedback circuit means in the transformer's output and a high resistance resistor in the transformer input for causing the input transformer to operate as a current transformer rather than a voltage transformer. The high gain negative feedback circuit in the transformer's output will cause the current in the primary and secondary windings of the transformer to be very small. Thus, in accordance with the invention, an input signal voltage to any two of the input terminals of this circuit will first be converted to a very low current in the windings of the transformers of the circuit which will in turn be reconverted to an output voltage at the circuit output. The gain of the circuit will be determined by the input resistance, the feedback resistance and the turn ratios of the transformer. With the transformer secondary feeding into a high gain, high negative feedback circuit, typically by feeding back the output of an operational amplifier to its inverting input, the voltage across the secondary winding of the transformer will be kept very small.

Thus, it can be seen that a primary object of the present invention is to provide input circuit for a audio amplifier, and for other signal processing equipment, which will accept a wide variety of input pin connections with no change in gain, and which will provide transformer coupling for an ohmically isolated input. In addition, ohmic isolation will be accomplished with very little distortion using relatively inexpensive, small and lightweight transformers. Other objects of the invention will become apparent from the following description of the embodiment of the invention illustrated in the accompanying drawings.

DESCRIPTION OF THE DRAWINGS

FIG. 1 is a schematic drawing of an ohmically isolated input circuit in accordance with the invention using direct transformer coupling.

FIG. 2 is a schematic drawing illustrating the operation of a transformer as a current transformer.

FIG. 3 is a block diagram representation of a three terminal input circuit in accordance with the invention using a current-to-current transformer instead of a voltage-to-voltage transformer.

FIG. 4 is a schematic illustration of the circuit generally represented in block diagram form in FIG. 3.

FIG. 5 is a table illustrating the polarity output of the circuit of the invention for a variety of different input pin connections.

DETAILED DESCRIPTION OF ILLUSTRATED EMBODIMENTS

Referring now to the drawings, FIG. 1 illustrates an ohmically isolated input circuit in accordance with the invention which consists of three input terminals 13, which for convenient future reference will be called input Nos. 1, 2 and 3. At the other end of the circuit is the circuit output 14 across two output terminals 15, 17. The output 14 is coupled to any two of the input terminals through transformer coupling means consisting of separate transformers 19, 21. To properly operate, the transformers 19, 21 must be magnetically isolated that is, transformers having separate cores which do not couple one to the other, and each transformer must have substantially identical turn ratios between their primary windings 23, 27 and secondary windings 25, 29. As will be discussed shortly, by using separate transformers with identical turn ratios, and assuming one transformer does not couple to the other, signal inputs to any two of the three input terminals will be transformer coupled to the output terminals of the circuit at the same voltage gain.

It is seen from the FIG. 1 circuit that the primary windings 23, 27 of the separate transformers 19, 21 are connected in series, as are the transformers secondary windings 25, 29. The series connection of the primary windings is electrically connected to the three input terminals 13 such that two of the input terminals, Nos. 1 and 3, are connected across primary winding 23 of transformer 19, another two of the terminals, Nos. 1 and 2, are connected across primary winding 27 of transformer 21, and the remaining terminal pair combination, Nos. 2 and 3, are connected across the series combination of input windings 23, 27. The output terminals 15, 17 are connected across the series combination of the transformer secondary windings 25, 29.

To understand the operation of the FIG. 1 circuit, one needs to consider the output signal across the output terminals 15, 17 for different input signals (for example, an audio signal received from the output of an audio preamplifier) applied across different pairs of input terminals. A voltage signal applied across terminals 1 and 3 will be applied across the primary winding 23 of transformer 19 which will induce a corresponding voltage across the secondary winding 25 of this transformer. Since transformer 19 does not couple to transformer 21 the only voltage across output terminals 15, 17 will be the voltage induced across secondary winding 25, which, assuming the transformer turn ratio of unity, would be the same as the input signal. Similarly, if the input voltages are applied across terminals 1 and 2, instead of terminals 1 and 3, the input voltage will instead be applied across the primary winding 27 of the other transformer 21, which will induce a corresponding voltage in the other transformer's secondary winding 29. In this case the voltage across output terminals 15, 17 is the same as the voltage across the secondary winding of transformer 21, and no voltage across the secondary winding of transformer 19.

If, on the other hand, the input voltage signal is applied across input terminals Nos. 2 and 3, this voltage will be split equally between the serially connected primary windings 23, 27 of the two transformers, and consequently half of the input voltage signal will be coupled to each of the transformer secondary windings 25, 29. The voltage across the output terminals would then be the sum of the secondary winding voltages. Thus, it can be seen that assuming equal turn ratios for each of the transformers 19, 21, and assuming that the transformers do not couple to one another, the output voltage across the output terminals 15, 17 will be the same for a given voltage input across any pair of input terminals out of the three possible pairing of terminals.

FIG. 5 illustrates various input connections for an input connector having pins numbered 1, 2 and 3 corresponding to the input terminal Nos. 1, 2 and 3 of the FIG. 1 input circuit. It can be seen from the table of FIG. 5 that the input circuit can receive a connector wired with any pin convention and with a balanced or unbalanced signal source output configuration. The positive signal can be assigned to any of the three pin connections and the remaining pins can be connected to the variety of configurations shown in the table, for example, with a balanced signal source output, one pin would be positive and at least one of the other pins would be negative. The remaining third pin could be either tied to negative, common, or not connected. With an unbalanced signal source output connected to the input circuit, the signal would be referenced to common and either two pins would be common or one pin would be common and the other pin not connected. Generally, connecting the signal source across pins 2 and 3 will provide the best performance in terms of common mode rejection and reduction of hum, however, any of the foregoing combinations of input connections would yield either a positive or negative output voltage with identical voltage gains.

FIG. 2 illustrates a simple transformer coupled circuit, generally denotes 31, wherein the transformer 33 acts as a current transformer rather than a voltage transformer. This simplified circuit is described to better understand the later described FIGS. 3 and 4 embodiments of the invention. The FIG. 2 circuit consists of a voltage signal source 35 connected to the primary winding 37 of transformers 33 through series resistor 39 having a resistance value, $R_i$, which is relatively high so that the transformer input is driven by an effective current source. In the circuit connected to the transformer's secondary winding 38 there is a high gain operational amplifier 41 having a negative feedback resistor 43 (with a resistance value $R_f$) which feeds back the output 45 of the operational amplifier to its inverting input 40. By connecting the inverting and non-inverting inputs 40, 42 of the operational amplifier 41 across the transformer's secondary winding 38, the voltage across secondary winding will be kept very low by virtue of of the negative feedback from the amplifier's high gain output 45 driving the voltage at the inverting input to that of the non-inverting input: the amplifier inputs will look like a virtual short circuit. The voltage at the circuit output 47 will be determined by the ratio of the input and feedback resistances 39, 43. Specifically, the output voltage at 47, assuming the transformer turn ratio is unity, can be expressed as follows:

$$\frac{V_o}{V_i} = \frac{R_f}{R_i}$$

where the $V_o$ is the voltage output at 47 and the $V_i$ is the voltage of the voltage input signal 35. Functionally, this circuit can be described as having a voltage to current conversion means, achieved by the high resistance input resistor, $R_i$; a current to current transformer which is the transformer 33 loaded by the virtual short circuit at the input of the operational amplifier 41; and a current to voltage conversion means which is the operational amplifier circuit in the negative feedback configuration.

From the above simplified circuit of FIG. 2, the embodiments of the invention illustrated in FIGS. 3 and 4 can be described. FIG. 3 shows, in a functional block diagram form, an ohmically isolated input circuit that operates similarly to the circuit described in connection with FIG. 1, except that the two transformers of the circuit operate as current to current transformers rather than voltage to voltage transformers. This produces a very advantageous circuit in that an ohmically isolated circuit can be provided using small, relatively inexpensive transformers which otherwise cannot practically be used. Due to the very small signal levels of the current transformer of the circuit the transformers will no longer be operating in non-linear regions of a hystersis curve produced by large voltage excursions, and will therefor no longer be a source of appreciable signal distortion.

With further reference to FIG. 3, the transformer coupled input circuit is seen to have input terminals (1, 2 and 3) that are connected to the circuit output 51 via a first circuit branch 53 and a second circuit branch 55 and a differential amplifier 58 which receives the outputs of the two circuit branches. Each of the circuit branches 53, 55 has a voltage to current conversion means 57, 59 which receives voltage signal inputs from the input terminals 1, 2, 3, and which is connected to one of the current to current transformers 61, 63. The current to current transformer of each branch is in turn connected to the current to voltage conversion means 65, 67. The two circuit branches are then inputted to the differential amplifier 58 which will produce an output at 51 across the output terminal 69 and ground 71.

Considering now the operation of the FIG. 3 circuit, the input voltage signal applied across terminals 1 and 3 will be conducted through the first circuit branch 53 to the non-inverting input 73 of the differential amplifier 58, while a signal input applied across input terminals 1 and 2 will be conducted through the second circuit branch 55 to the inverting input 75. In either of the above cases, when the signal is conducted through one branch, no signal is conducted through the opposite circuit branch and the differential amplifier 58, assuming unity gain throughout the circuit, will produce an output voltage equal to the input voltage, with the polarity output depending on which circuit branch is conducting. If, on the other hand, the input voltage is applied across input terminals 2 and 3, the two circuit branches 53, 55 will act as a voltage divider and, given equal impedances for each circuit branch, half the input signal will be conducted through the first circuit branch 53 and half the input signal will be conducted through second circuit branch 55. With the outputs of the circuit branches, and thus the inputs 73, 75 to the differential amplifier, being the opposite polarities, the outputs from the circuit branches will be added by the difference amplifier, producing the same voltage output at circuit output 51 as in the case where the voltage signal is only conducted through one of the circuit branches. Thus, a universal input circuit is provided whereby a voltage signal input to any combination of the three input terminals produces the same voltage output, and by virtue of the current to current transformers in the two circuit branches the output is ohmically isolated from the input.

A particular circuit implementation of the FIG. 3 functional block diagram is shown in FIG. 4 wherein the input terminals 1, 2 and 3 are connected to primary windings 77, 79 of magnetically isolated transformers 81, 83. Terminals 3 and 2 are connected to the top of the primary winding 77, 79 through current resistors 85, 87, and the center input terminal 1 is connected at 78 between the primary windings where they are serially connected.

The circuit on the secondary winding side of the transformers 81, 83 is referenced to common. The secondary windings 89, 91 of each of the circuit branch transformers 81, 83 are connected to identical operational amplifiers having a high negative feedback configuration whereby each branch of the circuit operates in the manner of the FIG. 2 circuit described above. As above-described, each of the operational amplifiers 93, 94 will cause their respective transformers to operate at very low signal levels. It will be noted that in the FIG. 4 circuit an additional feedback capacitance 95, 97 is added to the operational amplifier feedback circuit. The values of these feedback capacitances are chosen to provide high frequency roll-off which will compensate for stray capacitance in the transformer which will stabilize the circuit against high frequency oscillations. The operational amplifier circuits 93, 94 also act as a current to voltage conversion device for inputting voltage signals from the separate current branches to the difference amplifier 99. The difference amplifier 99 acts to sum the outputs from the operational amplifiers 93, 94 as described above in connection with the FIG. 3 circuit, with the gain of the difference amplifier being determined by the relative values of resistances $R_1$, $R_2$, $R_3$, $R_4$. The circuit output 101 will reflect the summing of the opposite polarity inputs to the difference amplifiers, with an inverted output 103 being suitably provided by an inverter 105.

The FIG. 4 circuit can be suitably constructed using inexpensive transformers with the following circuit element values: $R_i$, $R_f$, $R_1$, $R_2$, $R_3$, $R_4$, $R_5$, $R_6 = 10,000$ ohms; $R_7$, $R_8 = 100$ ohms; and $C_1$, $C_2 = 120$ picofarads. Transformers with a turn ratio of 2.22 to 1 have been suitably used.

Therefore, it can be seen that the present invention provides a unique ohmically isolated input circuit which allows great freedom in making input connections to the circuit from a variety of three conductor signal source output configurations without having to modify the circuits involved and wherein equipment following different output connector pin conventions can be connected together without difficulty. The circuit can be made from inexpensive parts and, because of the current transformer design, will avoid the need for bulky transformers which can greatly add to the size and weight of the equipment. Although the present invention is described in considerable detail in the foregoing specification, it will be understood that it is not intended that the invention be limited to such detailed description, except as necessitated by the following claims.

What we claim is:

1. An ohmically isolated input circuit comprising
   at least three input terminals for receiving an input voltage signal,
   a circuit output for providing an output voltage signal,
   at least two transformers, each of said transformers being substantially magnetically isolated one from the other and having primary and secondary windings with substantially matched turn ratios,
   means for connecting the primary windings of said transformers and said input terminals so that an input voltage signal applied between any two of said input terminals will be applied across different combinations of primary windings of said transformers to thereby induce voltages in different combinations of secondary windings of said transformers corresponding to the primary windings receiving the input voltage signal without cross coupling between transformers, the secondary windings of said isolated transformers being interconnected to said circuit output such that the voltage gain between any two input terminals and said circuit output is substantially the same.

2. The input circuit of claim 1 further comprising
   a first amplifier connected to the secondary winding of one of said transformers,
   a second amplifier connected to the secondary winding of the other of said transformers,
   circuit means for summing the signal outputs of said first and second amplifiers produced by a signal input at said input terminals, said summing circuit means being connected to pass said summed amplifier signal outputs to said circuit output whereby said input voltage signal is passed through one or the other of said transformers and its associated amplifier and out through said summing circuit means to said circuit output if said voltage signal is applied across one or the other of said transformer primary windings or whereby a portion of said input voltage signal is passed through each of said transformers and associated amplifiers and summed together again by said summing circuit whereupon it is passed to said circuit output if said input voltage signal is applied across the series combination of said primary windings.

3. The input circuit of claim 2 wherein
   each of said transformers has a resistance, $R_i$, connected in series with its primary winding, and
   each of said amplifiers is a high gain amplifier having negative feedback resistance, $R_f$, whereby the voltage gain between the input at the primary winding of the amplifier's associated transformer and the output of said amplifier is defined by the relation $$N \times \frac{R_f}{R_i},$$

where "N" is the primary to secondary winding turn ratio of said transformers.

4. The input circuit of claim 3 wherein the values of Ri and Rf are selected to be sufficiently high to cause said transformers to act as effective current transformers.

5. The input circuit of claim 1 wherein said transformers are connected the so that spurious hum outputs induced in each of said transformers are substracted whereas the transformer signal outputs produced from signal inputs to said input terminals are added.

6. An isolated input circuit comprising
   three input terminals, consisting of a first input terminal, a second input terminal and a third input terminal, for receiving an input voltage signal across any combination of said terminals,
   a circuit output,
   a first circuit branch connected for receiving signal inputs across said first and second input terminals,
   a second circuit branch connected for receiving signal inputs across said first and third input terminals, said first and second circuit branches further being connected so that a signal across said second and third terminals are divided between said first and second circuit braches,
   each of said circuit branches comprising a voltage to current conversion means, a current transformer connected for receiving a current signal from said voltage to current conversion means, and a current to voltage conversion means connected for reconverting the current signal output from said current transformer to a voltage signal, and
   circuit means for combining the voltage outputs of said two circuit branches and passing said combined outputs voltages to said circuit output.

7. The input circuit of claim 6 wherein the voltage outputs from said circuit branches are of reverse polarities and said circuit means of combining the voltage outputs of said two circuit branches includes a difference amplifier.

8. The input circuit of claim 7 wherein said current transformers of each of said circuit branches are connected so that hum output voltages induced in each of said circuit branches are of the same polarity whereby said difference ammplifier cancels said hum output voltages.

9. An ohmically isolated input circuit comprising
   at least three input terminals for receiving an input voltage signal across any two of said terminals,
   a circuit output for providing an output voltage signal, and
   transformer coupling means between said input terminals and said circuit output for transformer coupling said input terminals to said circuit output,
   said transformer coupling means including at least two transformers, each of which has a primary winding side and a secondary winding side and each of which is magnetically isolated from the other so that a signal across the primary winding side of one transformer does not induce a signal on the secondary winding side of the other of said transformers,
   said transformers further being electrically interconnected on this primary and secondary winding sides such that one pair of said input terminals are coupled to said circuit output through the primary and secondary winding sides of one of said transformers, anoher pair of said input terminals are coupled to said circuit output through the primary and secondary winding sides of the other of said transformers, and the third pair of said input terminals are coupled to said circuit output through the primary and secondary winding sides of both of said transformers, and the turn ratios of the transformers of said transformer circuit means being selected such that the voltage gain between any two of said input terminals and said circuit output is substantially the same.

10. The input circuit of claim 9 further including circuit means responsive to which said two transformers operate as current transformers for any input voltage signal whereby said transformers operate in small signal ragnes to minimize non-linear effects of said transformers on signals transmitted through said input circuit.

11. The input circuit of claim 10 wherein said circuit means includes an active high gain negative feedback circuit having a relatively high current limiting resistance on the primary side of said two transformers and presenting a virtual short circuit across the secondary sides of said two transformers of said transformer coupling means.

12. The input circuit of claim 11 wherein said active high gain negative feedback circuit is connected to produce an output signal voltage at said circuit output in response to an input voltage signal across any two of said input terminals, and wherein the voltage signal gain between said input terminals and said circuit output is established by the amount of feedback provided by said negative feedback circuit and the turn ratios of the transformers of said transformer coupling means.

13. The input circuit of claim 9 wherein said transformer coupling means includes circuit means for converting an input voltage signal impressed across two of said input terminals to a current signal such that the transformers of said transformer coupling means acts as a current transformers, and wherein active circuit means are provided at the output side of said current transformer coupling means for producing a voltage signal at said circuit output.

14. The input circuit of claim 13 wherein said active circuit means includes high gain negative feedback circuit means connected to present a low impedance load to the output terminal side of said transformer coupling means, the feedback of said feedback circuit means being chosen to produce an output voltage signal across said output terminals with a desired voltage gain over the input voltage signal.

15. The input circuit of claim 14 wherein the transformers of said transformers coupling means have substantially matched turn ratios.

16. The input circuit of claim 15 wherein
the primary windings of said transformers are connected in series,
the secondary windings of said transformers are connected in series, and
each of said primary windings and series connection of primary windings is connected between different pairs of said input terminals whereby a voltage signal impressed between any two of said input terminals will result in a voltage signal across the series connection of said secondary windings which will be the same regardless of which input terminals are selected.

17. The input circuit of claim 16 wherein the primary and secondary windings of said transformers are connected in bucking relation whereby voltages induced in said windings by common mode signals are substantially self cancelling.

* * * * *